(12) United States Patent
Kim et al.

(10) Patent No.: US 8,076,242 B2
(45) Date of Patent: Dec. 13, 2011

(54) METHODS OF FORMING AN AMORPHOUS SILICON THIN FILM

(75) Inventors: Jong Su Kim, Cheonan-si (KR); Hyung Sang Park, Seoul-si (KR); Yong Min Yoo, Cheonan-si (KR); Hak Yong Kwon, Suwon-si (KR); Tae Ho Yoon, Anseong-si (KR)

(73) Assignee: ASM Genitech Korea Ltd. (KR)

( * ) Notice: Subject to any disclaimer, the term of this patent is extended or adjusted under 35 U.S.C. 154(b) by 401 days.

(21) Appl. No.: 12/433,629

(22) Filed: Apr. 30, 2009

(65) Prior Publication Data
US 2009/0278224 A1  Nov. 12, 2009

(30) Foreign Application Priority Data

May 7, 2008  (KR) .................. 10-2008-0042367

(51) Int. Cl.
*H01L 21/44*  (2006.01)
(52) U.S. Cl. ................ 438/680; 438/685; 257/E21.462
(58) Field of Classification Search .................. 438/680, 438/685; 257/E21.462
See application file for complete search history.

(56) References Cited

U.S. PATENT DOCUMENTS

| | | | |
|---|---|---|---|
| 4,058,430 A | 11/1977 | Suntola et al. | |
| 4,282,267 A | 8/1981 | Küyel | |
| 4,747,367 A | 5/1988 | Posa | |
| 4,761,269 A | 8/1988 | Conger et al. | |
| 4,851,095 A | 7/1989 | Scobey et al. | |
| 4,935,661 A | 6/1990 | Heinecke et al. | |
| 5,071,670 A | 12/1991 | Kelly | |
| 5,278,435 A | 1/1994 | Van Hove | |
| 5,281,274 A | 1/1994 | Yoder | |
| 5,291,066 A | 3/1994 | Neugebauer | |
| 5,294,286 A | 3/1994 | Nishizawa | |
| 5,300,186 A | 4/1994 | Hitahara | |

(Continued)

FOREIGN PATENT DOCUMENTS

EP   0 442 490 A   8/1991

(Continued)

OTHER PUBLICATIONS

Aarik et al., "Effect of Growth Conditions on Formation of TiO$_2$-II Thin Films in Atomic Layer Deposition Process" Appl. Surf. Sci. 112,259 (1997).

(Continued)

*Primary Examiner* — Mary Wilczewski
*Assistant Examiner* — Telly Green
(74) *Attorney, Agent, or Firm* — Knobbe, Martens, Olson & Bear, LLP

(57) ABSTRACT

A method for forming an amorphous silicon thin film is disclosed. In some embodiments, a method includes loading a substrate into a reaction chamber; and conducting a plurality of deposition cycles on the substrate. Each of at least two of the cycles includes: supplying a silicon precursor to the reaction chamber during a first time period; applying radio frequency power to the reaction chamber at least partly during the first time period; stopping supplying of the silicon precursor and applying of the radio frequency power during a second time period between the first time period and an immediately subsequent deposition cycle; and supplying hydrogen plasma to the reaction chamber during a third time period between the second time period and the immediately subsequent deposition cycle. The method allows formation of an amorphous silicon film having an excellent step-coverage and a low roughness at a relatively low deposition temperature.

28 Claims, 8 Drawing Sheets

U.S. PATENT DOCUMENTS

| | | | |
|---|---|---|---|
| 5,321,713 A | 6/1994 | Khan | |
| 5,330,610 A | 7/1994 | Eres | |
| 5,356,673 A | 10/1994 | Schmitt et al. | |
| 5,374,570 A | 12/1994 | Nasu | |
| 5,395,791 A | 3/1995 | Cheng | |
| 5,443,033 A | 8/1995 | Nishizawa | |
| 5,443,647 A | 8/1995 | Aucoin et al. | |
| 5,458,084 A | 10/1995 | Thorne | |
| 5,469,806 A | 11/1995 | Mochizuki | |
| 5,483,919 A | 1/1996 | Yokoyama et al. | |
| 5,484,664 A | 1/1996 | Kitahara | |
| 5,496,582 A | 3/1996 | Mizutani et al. | |
| 5,618,395 A | 4/1997 | Gartner | |
| 5,641,984 A | 6/1997 | Aftergut | |
| 5,693,139 A | 12/1997 | Nishizawa et al. | |
| 5,707,880 A | 1/1998 | Aftergut | |
| 5,711,811 A | 1/1998 | Suntola et al. | |
| 5,730,802 A | 3/1998 | Ishizumi | |
| 5,769,950 A | 6/1998 | Takasu et al. | |
| 5,855,680 A | 1/1999 | Soininen et al. | |
| 5,916,365 A | 6/1999 | Sherman | |
| 6,015,590 A | 1/2000 | Suntola et al. | |
| 6,200,893 B1 | 3/2001 | Sneh | |
| 6,203,613 B1 | 3/2001 | Gates et al. | |
| 6,232,196 B1 | 5/2001 | Raaijmakers et al. | |
| 6,270,572 B1 | 8/2001 | Kim et al. | |
| 6,342,277 B1 | 1/2002 | Sherman | |
| 6,539,891 B1 | 4/2003 | Lee et al. | |
| 7,029,995 B2 | 4/2006 | Todd et al. | |
| 7,112,513 B2 | 9/2006 | Smythe, III et al. | |
| 7,186,630 B2 | 3/2007 | Todd | |
| 7,563,715 B2 * | 7/2009 | Haukka et al. | 438/680 |
| 2003/0082296 A1 * | 5/2003 | Elers et al. | 427/96 |
| 2004/0224504 A1 * | 11/2004 | Gadgil | 438/680 |
| 2005/0042865 A1 * | 2/2005 | Cabral et al. | 438/680 |
| 2006/0138393 A1 * | 6/2006 | Seo et al. | 257/2 |
| 2006/0199357 A1 | 9/2006 | Wan et al. | |
| 2007/0049023 A1 * | 3/2007 | Ahn et al. | 438/685 |
| 2007/0148350 A1 * | 6/2007 | Rahtu et al. | 427/249.17 |

FOREIGN PATENT DOCUMENTS

| | | |
|---|---|---|
| EP | 0 526 779 A1 | 2/1993 |
| WO | WO 00/63957 | 10/2000 |

OTHER PUBLICATIONS

Abeles, B. et al., "Amorphous Semiconductor Superlattices," *Physical Review Letters*, vol. 51, No. 21, pp. 2003-2006 (1983).

Ahonen et al., "A Study of ZnTe Films Grown on Glass Substrates Using an Atomic Layer Evaporation Method" Thin Solid Films 65, 301 (1980).

Ait-Lhouss et al., "Atomic Layer Epitaxy of GaAs from Tertiarybutylarsine and Triethylgallium" J. Appl. Phys. 78, 5834 (1995).

Akazawa, "Characterization of Self-limiting $SiH_2Cl_2$ Chemisorption and Photon-stimulated Desorption as Elementary Steps for Atomic-layer Epitaxy" Phys. Rev. B 54, 10917 (1996).

Ares et al., "Growth mechanisms in Atomic layer Epitaxy of GaAs" J. Appl. Phys. 83, 3390 (1998).

Asif Khan et al., "Atomic Layer Epitaxy of GaN over Sapphire using Switched Metalorganic Chemical Vapor Deposition" Appl. Phys. Lett. 60, 1366 (1992).

Asif Khan et al., "GaN/AlN Digital Alloy Short-period Superlattices by Switched Atomic Layer Metalorganic Chemical Vapor Deposition" Appl. Phys. Lett. 63, 3470 (1993).

Asikainen et al., "AFM and STM Studies on $In_2O_3$ and ITO Thin Films Deposited by Atomic Layer Epitaxy" Appl. Sur. Sci. 99, 91 (1996).

Asikainen et al., "Growth of Indium-Tin-Oxide Thin Films by Atomic Layer Epitaxy" J. Electrochem. Soc., 142,3538 (1995).

Asikainen et al., "Growth of $In_2O_3$ Thin Films by Atomic Layer Epitaxy" J. Electrochem. Soc., 141,3210 (1994).

Bedair et al., "Atomic Layer Epitaxy of III-V Binary Compounds" Appl. Phys. Lett. 47, 51 (1985).

Buchan et al., "Epitaxial Growth of GaAs with $(C_2H_5)2GaCl$ and $AsH_3$ in a Hot Wall system" J. Cryst. Growth 107, 331 (1991).

Chen et al., "Metalorganic Chemical Vapor Deposition of Indium Phosphide by Pulsing Precursors" Appl. Phys. Lett. 55, 987 (1989).

Dapkus et al., "Atomic Layer Epitaxy for the Growth of Heterostructures" Proc. Intern. Electron Devices Mtg. IEEE 472 (1988).

De Keijser, M. et al., "Atomic layer epitaxy of gallium arsenide with the use of atomic hydrogen," *Appl. Phys. Lett.*, vol. 58, No. 11, pp. 1187-1189 (1991).

Doi et al., "Stepwise Molecular Growth of GaAs by Switched Laser Metalorganic vapor Phase Epitaxy" Appl. Phys. Lett. 49, 785 (1986).

Dosho et al., "Atomic Layer Epitaxy of ZnSe-ZnTe Strained Layer Superlattices" J. Crys. Growth 95, 580 (1989).

Ducso et al., "Deposition of Tin Oxide into Porous Silicon by Atomic Layer Epitaxy" J. Electrochem. Soc., 143, 683 (1996).

Elers et al., "$NbCl_5$ as a Precursor in Atomic Layer Epitaxy" Appl. Surf. Sci., 82/83, 468 (1994).

Eres et al., "The Role of Hydride Coverage in Surface-limited Thin-film Growth of Epitaxial Silicon and Germanium" J. Appl. Phys. 74,7241 (1993).

Fan et al., "Low Temperature Growth of Thin Films of $Al_2O_3$ by Sequential Surface Chemical reaction of Trimethylaluminum and $H_2O_2$" Jpn. J. Appl. Phys., 30, L1139 (1991).

Fan, J. F. et al., "Low-Temperature Growth of Thin Films, of $Al_2O_3$ with Trimethylaluminum and Hydrogen Peroxide," *Mat. Res. Soc. Symp. Proc.*, vol. 222, pp. 327-332 (1991).

Faschinger et al., "Observation of Different Reflected High-energy Electron Diffraction Patterns during Atomic Layer Epitaxy Growth of CdTe Epilayers" J. Cryst. Growth 115, 692 (1991).

Fujii et al., "Atomic Layer Epitaxy of AlAs using Trimethylamine-alane and Amino-As" Appl. Phys. Lett. 62, 1420 (1993).

Fujii et al., "Desorption Properties of Amine Species during Atomic Layer Epitaxy of GaAs using Amino-As" Appl. Phys. Lett. 61, 2577 (1992).

Fujiwara et al., "Low Temperature Growth of $ZnS_xSe_{1-x}$ Alloys Fabricated by Hydrogen Radical Enhanced Chemical Vapor Deposition in an Atomic Layer Epitaxy Mode" J. Appl. Phys. 74, 5510 (1993).

Gong et al., "Atomic Layer Epitaxy of AlGaAs" Appl. Phys. Lett. 57, 400 (1990).

Goodman et al., "Atomic Layer Epitaxy" J. Appl. Physics 60, R65 (1986).

Gotoh et al., "Low-temperature growth of ZnSe-based Pseudomorphic Structures by Hydrogen-radical-enhanced Chemical vapor Deposition" .T. Cryst. Growth 117, 85 (1992).

Hartmann et al., "Atomic Layer Epitaxy of CdTe and MnTe" 1. Appl. Phys. 79, 3035 (1996).

Hasunuma et al., "Gas-phase-reaction-controlled Atomic-layer-epitaxy of Silicon" J. Vac. Sci. Technol., A 16, 679 (1998).

Haukka et al, "Growth mechanisms of Mixed Oxides on Alumina" Appl. Surf. Sci. 112, 23 (197).

Herman, M.A., "Atomic Layer Epitaxy—12 Years later" Vacuum 42, (1991).

Herman et al., "Atomic Layer Epitaxy of $Cd_{1-x}Mn_xTe$ Grown on CdTe(111)B Substrates" J. Crst. Growth 66, 480 (1984).

Herman et al., "Surface Morphology of CdTe Films Grown on CdTe(111) Substrates by Atomic Layer Epitaxy" J. Cryst. Growth 73, 403 (1985).

Hiramatsu, K. et al., "Formation of TiN films with low Cl concentration by pulsed plasma chemical vapor deposition," *J. Vac. Sci. Technol. A*, vol. 14, No. 3, pp. 1037-1040 (1996).

Horikoshi et al., "Low-temperature Growth of GaAs and AlAs-GaAs Quantumwell Layers by Modified Molecular Beam Epitaxy" Jpn. J. Appl. Phys. 25, L868 (1986).

Hunter et al., "A Novel Atmospheric Pressure Technique for the Deposition of ZnS by Atomic Layer Epitaxy Using Dimethylzinc." J. Cryst. Growth 91, 111 (1988).

Hyvarinen et al., "Mass Spectrometry Study of ZnS Atomic Layer Epitaxy Process" J. Cryst. Growth 86, 695 (1988).

Ihanus et al., "AFN Studies on ZnS Thin Films Grown by Atomic Layer Epitaxy" Appl. Surf. Sci. 120, 43 (1997).

Ihanus et al., "ALE Growth of $ZnS_{1-x}Se_x$ Thin Films by Substituting Surface Sulfer with Elemental Selenium" Appl. Surf. Sci. 112, 154 (1997).

Imai et al.., "A Novel Atomic Layer Method of Silicon" Jpn. J. Appl. Phys. 30, 3646 (1991).

Imai, S. et al., "Atomic layer epitaxy of Si using atomic H," *Thin Solid Films*, vol. 225, pp. 168-172 (1993).

Juppo et al., "Deposition of Molybdenum Thin Films by an Alternate Supply of $MoCl_5$ and Zn" J. Vac. Sci. Technol., A 16, 2845 (1998).

Juza et al., "Experimental Test of the Transition Layer Model of Atomic Layer Epitaxy" Appl, Phys. Lett. 53, 1396 (1988).

Kawakyu et al., "GaAs Atomic Layer Epitaxy Using the KrF Excimer Laser" Jpn. J. Appl. Phys. 28, L1439 (1989).

Kimura et al., "Atomic Layer Epitaxy of ZnSe on GaAs(IOOO) by Metalorganic Molecular Beam Epitaxy" J. Cryst. Growth 116, 283 (1992).

Koleski et al., "Atomic Layer Epitaxy of Si on Gc(100) : Direct Recoiling Studies of Film Morphology" J. Appl. Phys. 76, 1615 (1994).

Koleski, D. D. et al., "Atomic layer epitaxy of Si on Ge(100) using $Si_2Cl_6$ and atomic hydrogen," *Appl. Phys. Lett.*, vol. 64, No. 7, pp. 884-886 (1994).

Koleski et al., "Growth of Si on Si(100) via *H/Cl* Exchange and the Effect of Interfacial Boron" J. Appl. Phys. 72, 4073 (1992).

Koleski et al., "Precursors for Si Atomic Layer Epitaxy: Real Time Adsorption Studies on Si(100)" Appl. Phys. Lett. 61, 1802 (1992).

Kong et al., "White Light Emitting SrS:Pr Electroluminescent Devices Fabricated via Atomic Layer Epitaxy" Appl. Phys. Lett. 66,419 (1995).

Kuech et al., "Selective Epitaxy in the Conventional Metalorganic Vapor Phase Epitaxy of GaAs" Appl. Phys. Ltrs. 54, 910 (1989).

Kukli et al., "Atomic Layer epitaxy Growth of Aluminum Oxide Thin Films from a novel $Al(CH_3)_2Cl$ Precursor and $H_2O$" J. Vac. Sci. Technol, A 15, 2214 (1997).

Kukli et al., "Atomic Layer Epitaxy Growth of Tantalum Oxide Thin Films from $Ta(OC_2H_5)_5$ and $H_2O$" J. Electrochem. Soc., 142, 1670 (1995).

Kukli et al., "In Situ study of Atomic Layer epitaxy Growth of Tantalum Oxide thin films from $Ta(OC_2H_5)_5$ and $H_2O$" Appl. Surf. Sci. 112, 236 (1997).

Kukli et al., "Tailoring the Dielectric Properties of $HfO_2$-$Ta_2O_5$ Nanolaminates" Appl. Phys. Lett. 68, 3737 (1996).

Kumagai et al., "Comparative Study of $Al_2O_3$ Optical Crystalline Thin Films grown by Vapor Combinations of $Al(CH_3)_3/N_2O$ and $Al(CH_3)_3/H_2O_2$" Jpn. J.. Appl. Phys., 32, 6137 (1993).

Kurtz et al., "Self-organized CdSe/ZnSe Quantum Dots on a ZnSe (I11)a Surface" J. Cryst. 184/185, Growth 242 (1998).

Lakomaa et al., "Surface Reactions in $Al_2O_3$ Growth from Trimethylaluminum and Water by Atomic Layer Epitaxy" Appl. Surf. Sci. 107, 107 (1996).

Lee et al., "Growth of ZnSe on (100) GaAs by Atomic Layer Epitaxy" J. Cryst. Growth 117, 148 (1992).

Lee et al. "Self Limiting Growth on Nominally Oriented (111)A GaAs Substrates in Atomic Layer epitaxy" Appl. Surf. Sci. 103, 275 (1996).

Leskelä, M. et al., "Atomic Layer Epitaxy in Deposition of Various Oxide and Nitride Thin Films," *Journal De Physique IV Colloque C5, supplément au Journal de Physique II*, vol. 5, pp. C5-937-C5-951 (1995).

Leskela, M., "Atomic Layer Epitaxy in the Growth of Poly crystalline and Amorphous Films" Acta Polytechn. Scand., Ser. Chem. Techn., 195, 67 (1990).

Lin et al., "Adsorption and Thermal Reactions of Disilane and the Growth of Si Films on Ge(100)-(2x1)" Phys. Rev. B 47, 6543 (1993).

Maa et al., "Surface Reactions in the Atomic Layer Epitaxy of GaAs using Arsine" Appl. Phys. Lett. 58, 1762 (1991).

Mahajan, et al., "Surface Chemistry of Diethylsilane and Diethylgermane on Si(100):An Atomic Layer Epitaxy Approach" J. Vac. Sci. Technol. 12A, 2265 (1994).

Martensson et al., "Atomic Layer Epitaxy of Copper" J. Electrochem. Soc. , 145, 2926 (1998).

Matsunami et al., "Hetero-inferface Control and Atomic Layer Epitaxy of SiC" Appl. Surf. Sci. 112, 171 (1997).

McDermott et al., "Atomic Layer Epitaxy of the Ga-As-In-As Superalloy" Appl. Phys. Lett. 51, 1830 (1987).

McMurran et al., "Development of a Low-Temperature GaN Chemical Vapor Deposition Process based on a single Molecular Source $H_2GaN_3$" Appl. Phys. Lett., 74, 883 (1999).

Meguro et al., "Effects of Active Hydrogen on Atomic Layer Epitaxy of GaAs" Appl. Surf. Sci. 112, 118 (1997).

Morishita et al., "Atomic-layer Chemical-vapor-deposition of Silicon Nitride" Appl. Surf. Sci. 112, 198 (1997).

Nagel et al., "Modified chemical vapor deposition," Optical Fiber Communications: vol. 1 Fiber Fabrications, Ed. Tingye Li, Academic Press Inc., 1985, Chapter 1, pp. 1-64.

Nakano, M. et al., "Digital chemical vapor deposition of $SiO_2$," *Appl. Phys. Lett.*, vol. 57, No. 11, pp. 1096-1098 (1990).

Nelson, J.G., "Summary Abstract: Epitaxial Growth of ZnS and ZnSe on the Low Index Faces of GaAs Using Atomic Layer Epitaxy" J. Vac. Sci. Technol. A5, 2140 (1987).

Niinistö et al., "Synthesis of oxide thin films and overlayers by atomic layer epitaxy for advanced applications," *Materials Science & Engineering*, vol. B41, pp. 23-29 (1996).

Nishi et al., "In situ Optical Characterization of GaAs Surfaces under Alternating Supply of GaCI and $AsH_3$" Appl. Phys. Lett. 61,31 (1992).

Nishizawa et al., "Doping in Molecular Layer Epitaxy" J. Electrochem Soc. 136,478 (1989).

Nishizawa et al., "Gallium Arsenide Thin Films by Low-temperature Photochemical Processes" J. Vac. Sci. Technol. A5, 1572 (1987).

Nishizawa, J., "Molecular Layer Epitaxy and its Fundaments" J. Cryst. Growth 115, 12 (1991).

Nishizawa et al., "Molecular Layer Epitaxy of Silicon" J. Cryst. Growth 99, 502 (1990).

Nishizawa et al., "Silicon Molecular Layer Epitaxy" J. Electrochem. Soc. 137, 1898 (1990).

Ohno et al., "Atomic Layer Epitaxy of GaAs Using Triethylgallium and Arsine" Appl. Phys. Lett. 54, 2000 (1989).

Ohtsuka et al., "A New GaAs on Si Structure using AlAs Buffer Layers Grown by Atomic Layer Epitaxy" J.. Cryst. Growth 99, 346 (1990).

Ohtsuka et al., "Extremely High Be Doping of InGaAs by Low Temperature Atomic Layer Epitaxy" J. Cryst. Growth 115, 460 (1991).

Oikkonen, M., "Ellipsornetric Studies of Zinc Sulfide Thin Films Grown by Atomic Layer Epitaxy" J. Appl, Phys. 62, 1385 (1987).

Oikkonen et al., "X-ray Diffraction Study of Microstructure in ZnS Thin Films Grown from Zinc Acetate by Atomic Layer Epitaxy" Thin Solid Films 124, 317 (1985).

Ott et al., "Surface chemistry of $In_2O_3$ Deposition Using $in(CH_3)_3$ and $H_2O$ in a Binary Reaction Sequence" Appl. Surf. Sci. 112, 205 (1997).

Oya et al., "Growth of $\alpha$-$Al_2O_3$ Films by Molecular Layer Epitaxy" Appl, Phys. Lett. 51, 1143 (1987).

Ozeki et al., "Adsorption Mechanisms of Tertiarybutylarsine on Ga- and As- rich GaAs(001) Surfaces" Appl. Surf. Sci. 110 (1997) 112.

Ozeki et al., "New Approach to the Atomic Layer Epitaxy of GaAs Using a Fast Gas Stream" Appl. Phys. Lett. 53, 1509 (1988).

Pessa et al., "Atomic Layer Epitaxy and Characterization of CdTe Films Grown on CdTe (110) Substrates" J. Appl. Physics 54, 6047 (1983).

Pessa et al., "Atomic Layer Epitaxy of CdTe on the Polar (111)A and (111)B Surfaces of CdTe Substrates" J. Crst. Growth 67, 255 (1984).

Pessa et al., "Epitaxial Growth and Electronic Structure of CdTe Films" J. Vac. Sci. Technol. A2, 418 (1984).

Pessa et al., "Growth of $Cd_{1-x}Mn_xTe$ Films with $0<x<0.9$ by Atomic Layer Epitaxy" Appl. Phys. Lett. 45, 646 (1984).

Pessa et al., "Characterization of Surface Exchange Reactions Used to Grow Compound Films" Appl. Phys. Lett. 38, 131 (1981).

Piner et al., "Effect of Hydrogen on the Indium Incorporation in in GaN Epitaxial Films" Appl. Phys. Lett. 70, 461 (1997).

Reid et al., "Role of trimethylgallium Exposure Time in Carbon Doping and High Temperature Atomic Layer Epitaxy of GaAs" Appl. Phys. Left. 59, 2397 (1991).

Riihela et al., "Introducing Atomic Layer Epitaxy for the Deposition of Optical Thin Films" Thin Solid films, 289, 250 (1996).

Ritala et al., "Atomic Layer Epitaxy Growth of TiN Thin Films" J. Electrochem. Soc., 142,2731 (1995).

Ritala et al., "Atomic Layer Epitaxy Growth of TiN Thin Films from $TiI_4$ and $NH_3$" J. Electrochem. Soc., 145,2914 (1998).

Ritala et al., "Effects of Intermediate Zinc pulses on Properties of TiN and NbN Films Deposited by Atomic Layer Epitaxy" Appl. Surf. Sci. 120, 199 (1997).

Ritala et al "Enhanced Growth Rate in Atomic Layer Epitaxy of Indium Oxide and Indium-Tin Oxide Thin Films," Electrochem. and Solid State Ltrs., 1, 156 (1998).

Ritala et al., "Surface Roughness Reduction in Atomic Layer Epitaxy Growth of Titanium Dioxide Thin Films" Thin Solid Films, 249, 155 (1994).

Ritala et al., "Zirconium dioxide thin films deposited by ALE using zirconium tetrachloride as precursor," *Applied Surface Science*, vol. 75, (1994), pp. 333-340.

Sakuma et al., "Atomic layer Epitaxy of GaP and Elucidation for Self-limiting Mechanism" Appl. Phys. Lett. 56, 827 (1990).

Sakuma et al., "Comparative Study of Self-limiting Growth of GaAs using Different Ga-alkyl Compounds: $(CH_3)_3Ga$, $C_2H_5(CH_3)_2Ga$, and $(C_2H_5)_3Ga$" J. Appl. Phys. 68, 5660 (1990).

Seim et al., "Growth of $LaCoO_3$ thin films from β-Dikelonate precursors," *Appl. Surf. Science*, pp. 243-250, vol. 112 (1997).

Seong et al., "Ferroelectric $SrBi_2Ta_2O_9$ Thin Film Deposition at 550° C. by Plasma-enhanced Metalorganic CVD onto a Metalorganic CVD Platinum Bottom Electrode", J. Vac. Sci. Technol. A17, 83 (1999).

Skarp et al., ALE—reactor for Large Area, Appl. Surf. Sci. 112, 251 Depositions (1997).

Soininen et al., "Blue Electroluminescence of SrS:Ce, $SiCl_4$ Thin films Grown by Atomic Layer Epitaxy" Int. Display Res. Conf. Proceedings, Aug. 31-Sep. 3, 1993,p. 511.

Suda et al., Thermal and Photostimulated Reactions on $Si_2H_6$-adsorbed Si(100)2x1 Surfaces: Mechanisms of Si Film Growth by Atomic Layer Epitaxy, J. Vac. Sci. Technol. B7, 1171 (1989).

Sugahara, S. et al., "Atomic hydrogen-assisted ALE of germanium," *Applied Surface Science*, vol. 90, pp. 349-356 (1995).

Sugahara, S. et al., "Atomic layer epitaxy of germanium," *Applied Surface Science*, vols. 82/83, pp. 380-386 (1994).

Sugahara, S. et al., "Modeling of germanium atomic-layer-epitaxy," *Applied Surface Science*, vol. 112, pp. 176-186 (1997).

Sugahara et al., "Modeling of Silicon Atomic-layer-epitaxy" Appl. Surf. Sci. 107, 161 (1996).

Suntola, "Surface Chemistry of Materials Deposition at Atomic Layer Level" Appl. Surf. Sci. 100/101, 391 (1996).

Szczerbakow et al., "Monocrystalline ZnS-sphalerite Films Grown by Atomic Layer Epitaxy in a Gas Flow System" J. Cryst. Growth 183, 708 (1998).

Takahashi et al., "Self-limiting Adsorption of $SiCl_2H_2$ and its Application to the Layer-by-layer Photo-chemical process" Jpn. J. Appl. Phys. 30, L-209 (1991).

Taki et al., "Atomic Layer Epitaxy of GaAs using GaBr and GaI Sources" Appl. Surf. Sci. 112, 127 (1997).

Tammenmaa et al., "Zinc Chalcogenide Thin Films Grown by Atomic Layer Epitaxy Technique Using Zinc Acetate as Source Material" Thin Solid Films 124, 125 (1985).

Tanninen et al., "Comparative Study of the Crystal Phase, Crystallite Size and Microstrain in Electroluminescent ZnS:Mn Films Grown by ALE and Electron Beam Evaporation" Thin Solid Films 109, 283 (1983).

Tanninen et al., "Structural Characterization of Thin ZnS Films by X-Ray Diffraction" Thin Solid Films 90, 339 (1982).

Tasch et al., "Atomic Layer Epitaxy of Germanium" J. Vac. Sci. Technol. 12A, 2265 (1994).

Thompson et al. "Use of Atomic Layer Epitaxy buffer for the Growth of InSb on GaAs by Molecular heam Epitaxy" J. Appl. Phys. 69, 7166 (1991).

Tischler et al., "Growth and Characterization of Compound Semiconductors by Atomic Layer Epitaxy" J. Cryst. Growth 77, 89 (1986).

Tischler et al., "Self-limiting Mechanism in the Atomic Layer Epitaxy of GaAs" Appl. Phys. Lett. 48, 1681 (1986).

Tsurumi et al., "Fabrication of Barium Titanate/Strontium Titanate Artificial Superlattice by Atomic Layer Epitaxy" Jpn. J. Appl. Phys. 33, 5192 (1994).

Usui et al., "Atomic Layer Epitaxy of III-V Compounds by Hydride VPE" Int, Symp. GaAs and related compounds, Las Vegas, NV, 1986, *Int. Phys. Cant* Ser. No. 83:Chapter 3, p. 129.

Usui et al., "GaAs Atomic Layer Epitaxy by Hydride VPE" Jpn. J. Appl. Phys. 25, L212 (1986).

Utrianinen et al., "Controlled Electrical conductivity in $SnO_2$ thin films by oxygen or hydrocarbon assisted atomic layer epitaxy", Electrochem. Soc. 146, 189 (1999).

Watanabe et al., "The Mechanism of Atomic Layer Epitaxy of GaAs using Trimethylgallium and Arsine" Vacuum 41, 965 (1990).

Wisotski et al., "Room-temperature Growth of $ZrO_2$ Thin Films using a novel hyperthermal oxygen-atom source", J. Vac. Sci. Technol. A17, 14 (1999).

Yamada et al., "Atomic layer Deposition of ZnO Transparent Conducting Oxides" Appl. Surf. Sci. 112, 216 (1997).

Yamaga et al., "Atomic Layer Epitaxy of ZnS by a New Gas Supplying System in Low-pressure Metalorganic Vapor Phase Epitaxy" .T. Cryst. Growth 117, 152 (1992).

Yamamoto et al., "Atomic Layer-by-layer Epitaxy of Oxide Superconductors by MOCVD" Appl. Surf. Sci. 112, 30 (1997).

Yao et al., "Growth process in Atomic Layer Epitaxy of Zn Chalcogenide Single Crystalline Films on (100) GaAs" Appl. Phys. Lett. 48, 160 (1986).

Yao et al., "Photoluminescence Properties of ZnSe Single Crystalline Films Grown by Atomic Layer Epitaxy" Appl. Phys. Lett. 48, 1615 (1986).

Yarmoff et al "Atomic Layer Epitaxy of Silicon by Dichlorosilanc Studied with Core Level Spectroscopy" J. Vac. Sci. Technol. AI0, 2303 (1992).

Yokoyama et al., "Atomic Layer Controlled Deposition of Silicon Nitride and an in situ Growth Observation by Infrared Reflection Absorption Spectroscopy" Appl. Surf. Sci. 112, 75 (1997).

Yokoyama et al., "Atomic Layer Epitaxy of GaAs using Nitrogen Carrier Gas" Appl. Phys, Lett. 59,2148 (1991).

Yu et al., "Reaction of Trimethylgallium in the Atomic Layer Epitaxy of GaAs(100)" Appl. Phys. Lett. 55, 1011 (1989).

Yun et al, "Dependence of Atomic Layer Deposited $Al_2O_3$ Films Characteristics on Growth Temperature and Al Precursors of $Al(CH_3)_3$ and $AlCl_3$," J. Vac. Sci. Technol., A 15, 2993 (1997).

Zhu et al., "Nitrogen Doping During Atomic Layer Epitaxial Growth of ZnSe" Appl. Phys. Lett. 67, 3927 (1995).

\* cited by examiner

METHODS OF FORMING AN AMORPHOUS SILICON THIN FILM

CROSS-REFERENCE TO RELATED APPLICATIONS

This application claims priority to and the benefit of Korean Patent Application No. 10-2008-0042367 filed in the Korean Intellectual Property Office on May 7, 2008, the entire contents of which are incorporated herein by reference.

BACKGROUND

1. Field of the Invention

The present invention relates to a method for forming a thin film. More particularly, the present invention relates to a method of forming an amorphous silicon thin film.

2. Description of the Related Art

In manufacturing semiconductor devices, various apparatuses and processes have been developed to provide a high quality thin film on a substrate. Several methods have been used to form thin films, employing surface reaction of a semiconductor substrate. The methods include vacuum evaporation deposition, Physical Vapor Deposition (PVD), Molecular Beam Epitaxy (MBE), different variants of Chemical Vapor Deposition (CVD) (including low-pressure and organometallic CVD and plasma-enhanced CVD), and Atomic Layer Epitaxy (ALE). ALE was studied extensively for semiconductor deposition and electroluminescent display applications, and has been more recently referred to as Atomic Layer Deposition (ALD) for the deposition of a variety of materials.

An exemplary physical vapor deposition method is sputtering. However, sputtering tends to exhibit a poor step-coverage. Thus, sputtering may not be used for forming a film having a uniform thickness on a surface with protrusions and depressions, particularly in high aspect ratio applications like DRAM capacitors.

In a chemical vapor deposition process, two or more reactant gases are reacted with one another over a surface of a substrate. One or more resulting compounds that are produced by the gas phase reaction are deposited on the surface of the substrate. Chemical vapor deposition typically provides a film having a good step-coverage, but has a dependency on temperature and gas supply uniformity. In addition, chemical vapor deposition causes less damage to a substrate than physical vapor deposition. Chemical vapor deposition can also be used in mass production of thin films at a relatively low cost.

Generally, ALD involves sequential introduction of separate pulses of at least two reactants until a layer of a desired thickness is deposited through self-limiting adsorption of monolayers of materials on a substrate surface. For example, in forming a thin film including an AB material, a cycle of four sequential steps of: (1) a first reactant gas A supply; (2) an inert purge gas supply; (3) a second reactant gas B supply; and (4) an inert purge gas supply is repeated. An atomic layer deposition (ALD) method can be performed at a low temperature, for example, a temperature lower than 400° C.

The above information disclosed in this Background section is only for enhancement of understanding of the background of the invention and therefore it may contain information that does not form prior art already known in this country to a person of ordinary skill in the art.

SUMMARY

In one embodiment, a method for forming an amorphous silicon thin film on a substrate includes: loading a substrate into a reaction chamber; and conducting a plurality of deposition cycles on the substrate. Each of at least two of the cycles includes: supplying a silicon precursor to the reaction chamber during a first time period; supplying hydrogen plasma to the reaction chamber at least partly during the first time period; and stopping supplying of the silicon precursor and the hydrogen plasma to the reaction chamber during a second time period between the first time period and an immediately subsequent deposition cycle.

In another embodiment, a method for forming an amorphous silicon thin film on a substrate includes: loading a substrate into a reaction chamber; and conducting a plurality of deposition cycles on the substrate. Each of at least two of the cycles includes: supplying a silicon precursor to the reaction chamber during a first time period; applying radio frequency power to the reaction chamber at least partly during the first time period; stopping supplying of the silicon precursor and applying of the radio frequency power during a second time period between the first time period and an immediately subsequent deposition cycle; and supplying hydrogen plasma to the reaction chamber during a third time period between the second time period and the immediately subsequent deposition cycle.

DETAILED DESCRIPTION OF THE EMBODIMENTS

Figure 1:
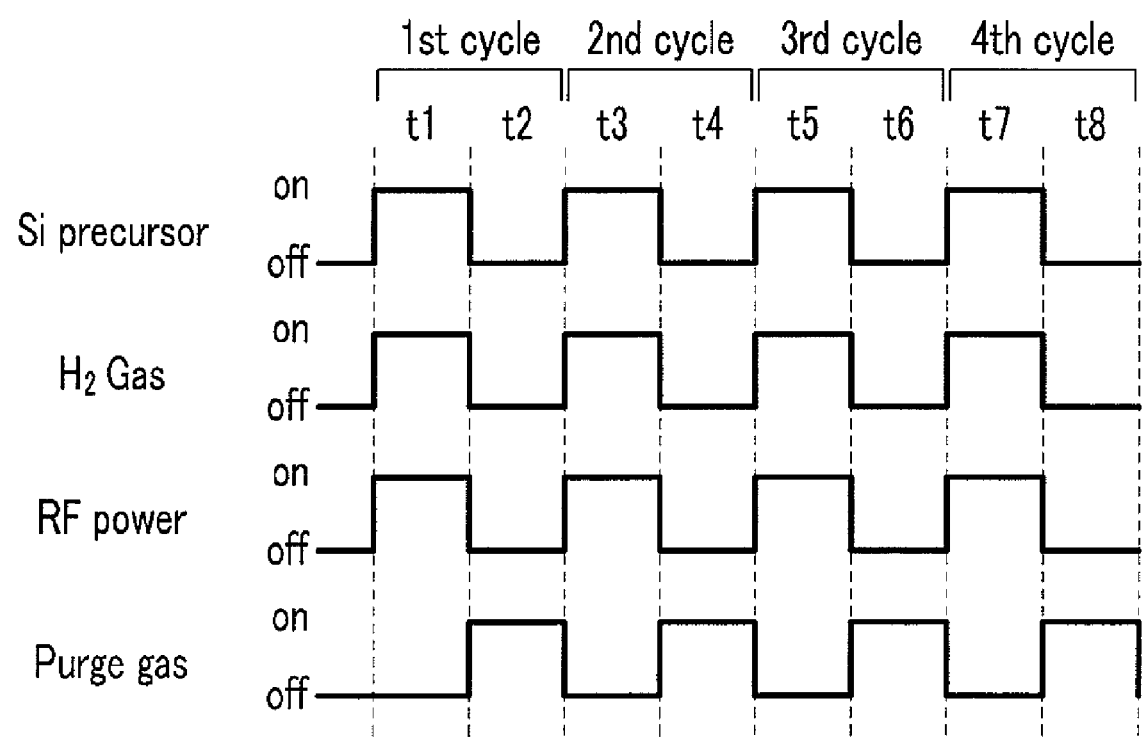
FIG. 1 is a timing diagram illustrating a method for forming an amorphous silicon thin film according to one embodiment.

The present invention will be described more fully hereinafter with reference to the accompanying drawings, in which exemplary embodiments of the invention are shown. As those skilled in the art would realize, the described embodiments may be modified in various different ways, all without departing from the spirit or scope of the present invention.

Various CVD methods can be used for depositing an amorphous silicon thin film. If a low pressure chemical vapor deposition (LPCVD) method is used with a silicon precursor, polysilicon, rather than amorphous silicon, tends to be formed. A resulting thin film tends to have a surface having a relatively high roughness. If a plasma CVD process is used, deposition may be carried out at a relatively low temperature (for example, about 350° C. to about 500° C.), and an amorphous silicon thin film may be formed. However, such an amorphous thin film may not provide a good step-coverage over fine features having a high aspect ratio.

If a plasma enhanced atomic layer deposition (PEALD) process is used, a deposition process may be carried out at a relatively low temperature. In a PEALD process, however, if a precursor is not well-adsorbed on a surface of a substrate, it is difficult to deposit a film at a commercially acceptable deposition rate.

In certain embodiments, an undoped amorphous silicon film is formed on a substrate in a reaction chamber by a cyclical deposition process using a silicon precursor and hydrogen plasma. During the deposition process, the hydrogen plasma reacts with the silicon precursor by either or both of a surface reaction and a gas phase reaction, and removes ligands from the silicon precursor. In different embodiments, the hydrogen plasma can be supplied in pulses simultaneously with and/or subsequent to the supply of the silicon precursor. In either cases, the supplies of the reactants are pulsed while plasma power is applied to the reaction chamber.

In some embodiments, a method includes conducting a plurality of deposition cycles. At least one of the cycles includes steps of: supplying a silicon precursor to a reaction chamber during a first time period; supplying hydrogen plasma to the reaction chamber at least partly during the first time period; and supplying a purge gas to the reaction chamber during a second time period subsequent to the first time period. In another embodiment, the at least one of the cycles may further include a step of supplying hydrogen plasma to the reaction chamber during a third time period subsequent to the second time period. In yet another embodiment, the at least one of the cycles may further include a step of supplying a purge gas to the reaction chamber during a fourth time period subsequent to the third time period.

In other embodiments, a method includes conducting a plurality of deposition cycles. At least one of the cycles includes steps of supplying a silicon precursor to the reaction chamber without supplying hydrogen gas during a first time period; applying radio frequency power to the reaction chamber at least partly during the first time period; supplying a purge gas to the reaction chamber during a second time period subsequent to the first time period; and supplying hydrogen plasma to the reaction chamber during a third time period subsequent to the first time period.

In the illustrated embodiments, the time periods are separated by pauses in the supplies of reactants. During the pauses, a purge gas may be supplied to the reaction chamber to remove excess reactants and any by-products from the reaction chamber.

Referring to FIG. 1, a method for forming an amorphous silicon thin film on a substrate according to one embodiment will be described below. The substrate may be formed of silicon, and may also include features or structures formed thereon. The features or structures may include a metal, a semiconductor, and/or an insulator.

First, the substrate is loaded into a reaction chamber of a reactor. In one embodiment, the reactor may be a single wafer CVD reactor, such as EPSILON™ from ASM America, Inc. of Phoenix, Ariz., or a single wafer ALD reactor, such as a GENI CM-2000 reactor commercially available from ASM Genitech Korea of Cheonan-si, Chungcheongnam-do, Republic of Korea. In other embodiments, the reactor may be a single wafer ALD reactor with a showerhead, for example, a Stellar™ reactor commercially available from ASM Japan K.K., Tokyo, Japan. In certain embodiments, a lateral flow reactor, such as the reactor disclosed by U.S. Pat. No. 6,539,891, the disclosure of which is incorporated herein by reference. A skilled artisan will appreciate that any suitable type of reactor can be used for the method. A surface of the substrate is exposed to the reaction space.

The illustrated method includes a plurality of deposition cycles. Although only first to fourth cycles are illustrated in FIG. 1, the method may include any selected number of cycles, depending on the thickness of a film to be deposited on the substrate.

During a first time period t1, a silicon (Si) precursor pulse is supplied to the reaction chamber. The silicon precursor may include one or more silicon atoms and one or more ligands (e.g., atoms or functional groups) bonded to the silicon atoms. In some embodiments, the silicon precursor may be a silane compound, such as silanes, disilanes, trisilanes, chlorosilanes, and derivatives thereof. Examples of silane compounds include, but are not limited to, monosilane ($SiH_4$), disilane ($Si_2H_6$), chlorosilane ($SiH_3Cl$), dichlorosilane (DCS or $SiH_2Cl_2$), trichlorosilane (TCS or $SiHCl_3$), hexachlorodisilane (HCDS or $Si_2H_6$), and silicon tetrachloride ($SiCl_4$). Examples of chlorosilanes include, but are not limited to, chlorosilane ($SiH_3Cl$), dichlorosilane (DCS or $SiH_2Cl_2$), trichlorosilane (TCS or $SiHCl_3$), hexachlorodisilane (HCDS or $Si_2H_6$), and silicon tetrachloride ($SiCl_4$). In other embodiments, any suitable silicon-containing compound may be used as a silicon precursor.

The silicon precursor may be supplied with a carrier gas (such as Ar, He, or $N_2$) at a flow rate of, for example, about 50 sccm to about 500 sccm, and optionally about 100 sccm to about 300 sccm. In one embodiment where the silicon precursor is in a liquid form, a bubbling method may be used to provide the precursor to the reaction chamber in a gaseous form. In such an embodiment, the carrier gas may be supplied through a silicon precursor container. In other embodiments, a liquid delivery system (LDS) may be used to vaporize a silicon precursor, which is then drawn from over the liquid and entrained in the carrier gas flow. A skilled artisan will appreciate that various other methods can be used for providing the silicon precursor to the reaction chamber in a gaseous form. The duration of the first time period t1 can be between about 0.1 seconds and about 3.0 seconds, and optionally between about 0.5 seconds and about 1.5 seconds.

During the first time period t1, a hydrogen ($H_2$) gas pulse is also simultaneously or overlappingly supplied to the reaction chamber. In addition, radio frequency (RF) power is applied to the reaction chamber, generating hydrogen plasma in situ. The hydrogen gas may be supplied at a flow rate of, for example, about 50 sccm to about 500 sccm, and optionally about 100 sccm to about 300 sccm. The RF power may range from about 50 W to about 800 W at a frequency of about 5.0 MHz to about 30.0 MHz. In other embodiments, remotely generated hydrogen plasma may be supplied in pulses to the reaction chamber, instead of generating hydrogen plasma in situ.

During the first time period t1, both a gas phase reaction and a surface reaction occur over the substrate. At least a portion of the silicon precursor is adsorbed physically or chemically on the exposed surface of the substrate while excess silicon precursor may remain unadsorbed (in the gas phase) within the reaction chamber. Part of the excess silicon precursor may react with the hydrogen plasma by the gas phase reaction. The hydrogen plasma may remove at least some of the ligands from the excess silicon precursor in the gas phase, thereby depositing a silicon-containing layer on the surface of the substrate. For example, in an embodiment where the silicon precursor is hexachlorodisilane (HCDS), HCDS and $H_2$ plasma react with each other, forming amorphous silicon while producing HCl as a by-product.

In addition, the silicon precursor adsorbed on the surface of the substrate may also react with the hydrogen plasma. The silicon precursor adsorbed on the surface may include molecules, each of which includes one or more silicon atoms and one or more ligands. The hydrogen plasma may remove the ligands from the silicon precursor adsorbed on the substrate surface by the surface reaction, thereby leaving silicon atoms on the substrate surface. The silicon atoms may form part of the silicon-containing layer. The silicon-containing layer may be undoped amorphous silicon.

During a second time period t2, a purge gas is supplied to the reaction chamber to remove any unreacted precursor and by-products. Examples of purge gases include, but are not limited to, relatively inert gases, such as argon (Ar), nitrogen ($N_2$), and/or helium (He). The duration of the second time period t2 can be between about 0.1 seconds and about 3.0 seconds, and optionally between about 0.5 seconds and about 1.5 seconds. During the second time period t2, the purge gas may also remove ligands bonded via a dangling bond to silicon atoms adsorbed on the substrate. The term "dangling bond" generally refers to a chemical bond associated with an atom in the surface layer of a solid that does not join the atom with a second atom but extends in the direction of the solid's exterior.

The first and second time periods t1, t2 form a deposition cycle. The deposition cycle may be repeated at least twice until a thin film having a desired thickness is formed. For example, during a third time period t3, the silicon precursor may be supplied to the reaction chamber along with hydrogen gas activated by RF power. During a fourth time period t4, the purge gas may be supplied to the reaction chamber. In one embodiment, the deposition method may be performed at a reaction chamber temperature of about 300° C. or lower.

In the method described above, after the first time period t1 in each deposition cycle, a substantial portion of the silicon-containing layer formed on the surface of the substrate may include silicon atoms without ligands. However, at least some portion of the silicon-containing layer may include ligands bonded to the silicon atoms via a dangling bond. During the second time period t2, such ligands are at least partly removed from the silicon-containing layer by the purge gas, thus clearing the top surface of the silicon-containing layer. This allows more effective deposition of the silicon precursor during the next deposition cycle. Thus, the layer resulting from the method can have a uniform thickness and a good step coverage compared to a layer formed by a conventional CVD process.

Figure 2:
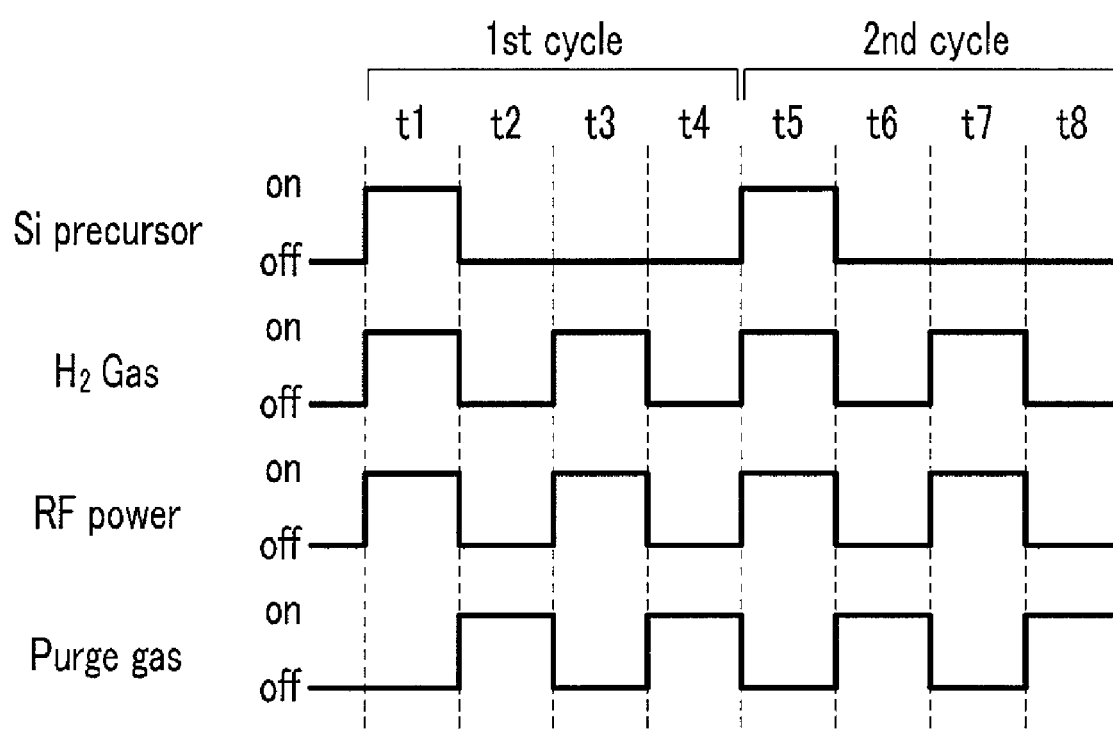
FIG. 2 is a timing diagram illustrating a method for forming an amorphous silicon thin film according to another embodiment.

Referring to FIG. 2, a method for forming an amorphous silicon thin film on a substrate according to another embodiment will be described below. First, the substrate is loaded into a reaction chamber. The details of the reaction chamber and the substrate can be as described above with respect to FIG. 1.

The illustrated method includes a plurality of deposition cycles. Although only first and second cycles are illustrated in FIG. 2, the method may include any selected number of cycles, depending on the thickness of a film to be deposited on the substrate.

During a first time period t1, a silicon (Si) precursor gas pulse is supplied to the reaction chamber. Details of the silicon precursor can be as described above with respect to those of the silicon precursor in FIG. 1. The precursor gas may be supplied with a carrier gas (such as Ar, He, or $N_2$) at a flow rate of, for example, about 50 sccm to about 500 sccm, and optionally about 100 sccm to about 300 sccm. The duration of the first time period t1 can be between about 0.1 seconds and about 3.0 seconds, and optionally between about 0.5 seconds and about 1.5 seconds.

During the first time period t1, a hydrogen ($H_2$) gas pulse is also provided to the reaction chamber, and radio frequency (RF) power is applied to the reaction chamber, generating hydrogen plasma in situ. The hydrogen gas may be supplied at a flow rate of, for example, about 50 sccm to about 500 sccm, and optionally about 100 sccm to about 300 sccm. The RF power may range from about 50 W to about 800 W at a frequency of about 5.0 MHz to about 30.0 MHz. In other embodiments, remotely generated hydrogen plasma may be supplied to the reaction chamber in pulses, instead of generating hydrogen plasma in situ.

During the first time period t1, both a gas phase reaction and a surface reaction occur over the substrate. At least a portion of the silicon precursor is adsorbed physically or chemically on the exposed surface of the substrate while excess silicon precursor may remain unadsorbed (in the gas phase) within the reaction chamber. Part of the excess silicon precursor may react with the hydrogen plasma by the gas phase reaction. The hydrogen plasma may remove at least some of the ligands from the excess silicon precursor in the gas phase, thereby depositing a silicon-containing layer on the surface of the substrate. For example, in an embodiment where the silicon precursor is hexachlorodisilane (HCDS), HCDS and $H_2$ plasma react with each other, forming amorphous silicon while producing HCl as a by-product.

In addition, the silicon precursor adsorbed on the surface of the substrate may also react with the hydrogen plasma. The silicon precursor adsorbed on the surface may include molecules, each of which includes one or more silicon atoms and one or more ligands. The hydrogen plasma may remove the ligands from the silicon precursor adsorbed on the substrate surface by the surface reaction, thereby leaving silicon atoms on the substrate surface. The silicon atoms may form part of the silicon-containing layer. The silicon-containing layer may be undoped amorphous silicon.

During a second time period t2, a purge gas is supplied to the reaction chamber to remove any unreacted precursor and by-products. Examples of purge gases include, but are not limited to, relatively inert gases, such as argon (Ar), nitrogen ($N_2$), and/or helium (He). The duration of the second time period t2 can be between about 0.1 seconds and about 3.0 seconds, and optionally between about 0.5 seconds and about 1.5 seconds. In certain embodiments, this step may be omitted.

During a third time period t3, another hydrogen gas ($H_2$) pulse is supplied to the reaction chamber, and radio frequency (RF) power is applied to the reaction chamber to activate the hydrogen gas, thereby generating hydrogen plasma in the absence of silicon precursor supply. The hydrogen gas may be supplied at a flow rate of, for example, about 50 sccm to about 500 sccm, and optionally about 100 sccm to about 300 sccm. The RF power may range from about 50 W to about 800 W at a frequency of about 5.0 MHz to about 30.0 MHz. In other embodiments, remotely generated hydrogen plasma may be supplied to the reaction chamber, instead of generating hydrogen plasma in situ. The duration of the third time period t3 can be between about 0.1 seconds and about 3.0 seconds, and optionally between about 0.5 seconds and about 1.5 seconds.

At least a portion of the precursor adsorbed on the substrate during the first time period t1 may still have ligands remaining after the first time period t1. The hydrogen plasma supplied during the third time period t3 may remove the remaining ligands from the silicon precursor adsorbed on the substrate surface, thereby forming amorphous silicon. In an embodiment where the silicon precursor is hexachlorodisilane (HCDS), HCDS and hydrogen plasma may react with each other, leaving only silicon atoms on the substrate surface while producing HCl as a by-product.

In the method of FIG. 2, after the first time period t1 in each deposition cycle, a substantial portion of the silicon-containing layer formed on the surface of the substrate may include silicon atoms without ligands. However, at least some portion of the silicon-containing layer may include ligands bonded via a dangling bond to the silicon atoms. During the second time period t2, such ligands are at least partly removed from the silicon-containing layer by the purge gas, thus clearing the top surface of the silicon-containing layer. Further, during the third time period t3, any remaining ligands bonded to silicon atoms in the silicon-containing layer may be more effectively removed by the hydrogen plasma. This allows more effective deposition of the silicon precursor during the next deposition cycle. Thus, the layer resulting from the method can have a uniform thickness and a good step coverage compared to a layer formed by a conventional CVD process.

During a fourth time period t4, a purge gas is supplied to the reaction chamber to remove any unreacted precursor and/or by-products. Examples of purge gases include, but are not limited to, argon (Ar), nitrogen ($N_2$), and helium (He). The duration of the fourth time period t4 can be between about 0.1 seconds and about 3.0 seconds, and optionally between about 0.5 seconds and about 1.5 seconds. In certain embodiments, this step may be omitted.

The first to fourth time periods t1-t4 form a deposition cycle. The deposition cycle may be repeated at least twice until a thin film having a desired thickness is formed. For example, during a fifth time period t5, the silicon precursor may be supplied to the reaction chamber along with hydrogen gas activated by RF power. During a sixth time period t6, a purge gas may be supplied to the reaction chamber. During a seventh time period t7, hydrogen gas may be supplied to the reaction chamber while RF power is applied to the reaction chamber. Subsequently, during an eighth time period t8, a purge gas may be supplied to the reaction chamber. The fifth to the eighth time periods t5-t8 form another deposition cycle. It will be understood that cycles can have arbitrarily defined starting and stopping points (e.g., t2-t5 can be considered a cycle). In one embodiment, the method may be carried out at a reaction chamber temperature of about 300° C. or lower.

Figure 3:
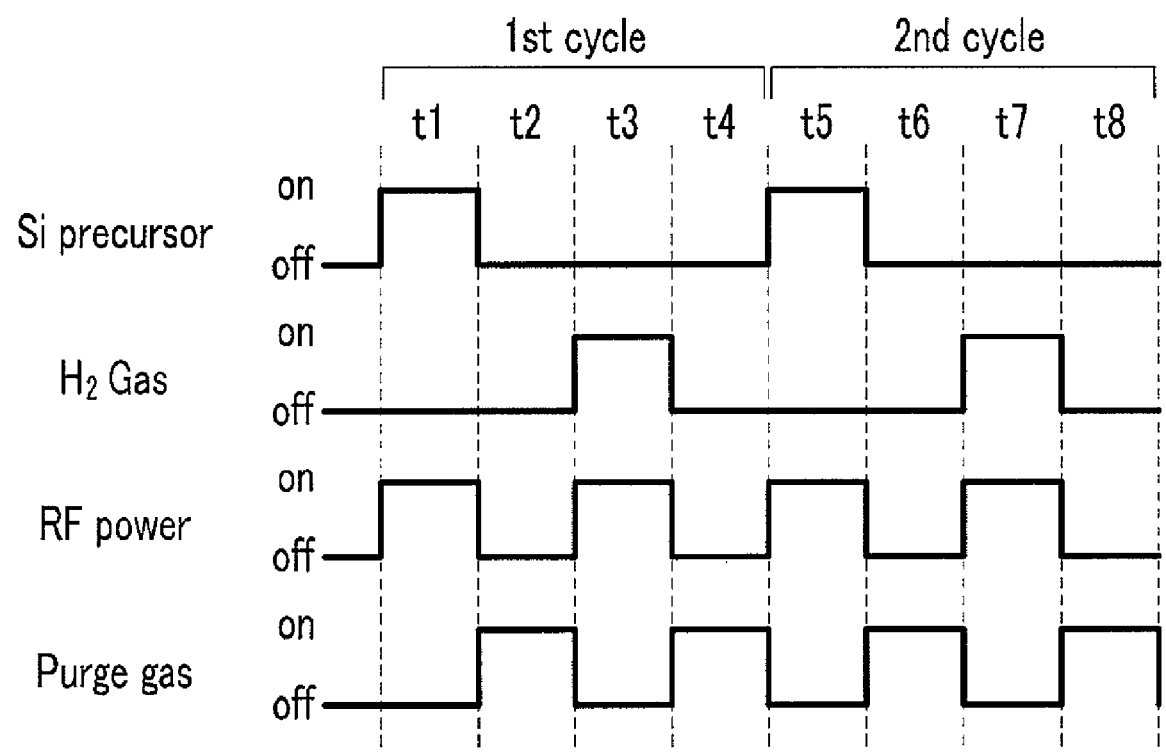
FIG. 3 is a timing diagram illustrating a method for forming an amorphous silicon thin film according to yet another embodiment.

Referring to FIG. 3, a method for forming an amorphous silicon thin film on a substrate according to another embodiment will be described below. First, the substrate is loaded into a reaction chamber. The details of the reaction chamber and the substrate can be as described above with respect to FIG. 1.

The illustrated method includes a plurality of deposition cycles. Although only first and second cycles are illustrated in FIG. 3, the method may include any selected number of cycles, depending on the thickness of a film to be deposited on the substrate.

During a first time period t1, a silicon (Si) precursor gas pulse is supplied to the reaction chamber in the absence of hydrogen supply. Details of the silicon precursor can be as described above with respect to those of the silicon precursor in FIG. 1. The precursor gas may be supplied with a carrier gas (such as Ar, He, or $N_2$) at a flow rate of, for example, about 50 sccm to about 500 sccm, and optionally about 100 sccm to about 300 sccm. The duration of the first time period t1 can be between about 0.1 seconds and about 3.0 seconds, and optionally between about 0.5 seconds and about 1.5 seconds.

During the first time period t1, radio frequency (RF) power is also applied to the reaction chamber, but no hydrogen gas is supplied to the reaction chamber. The RF power may range from about 50 W to about 800 W at a frequency of about 5.0 MHz to about 30.0 MHz.

During the first time period t1, the silicon precursor is physically or chemically adsorbed on the substrate surface, forming a layer. The layer includes precursor molecules, each of which includes one or more silicon atoms and ligands.

During a second time period t2, a purge gas is supplied to the reaction chamber to remove any unreacted precursor and by-products. Examples of purge gases include, but are not limited to, inert gases, such as argon (Ar), nitrogen ($N_2$), and/or helium (He). The duration of the second time period t2 can be between about 0.1 seconds and about 3.0 seconds, and optionally between about 0.5 seconds and about 1.5 seconds. In certain embodiments, this step may be omitted.

During a third time period t3, a hydrogen ($H_2$) gas pulse is supplied to the reaction chamber, and radio frequency (RF) power is applied to the reaction chamber to activate the hydrogen gas, thereby generating hydrogen plasma in the absence of silicon precursor supply. The hydrogen gas may be supplied at a flow rate of, for example, about 50 sccm to about 500 sccm, and optionally about 100 sccm to about 300 sccm. The RF power may range from about 50 W to about 800 W at a frequency of about 5.0 MHz to about 30.0 MHz. In other embodiments, remotely generated hydrogen plasma may be supplied in pulses to the reaction chamber, instead of generating hydrogen plasma in situ. The duration of the third time period t3 can be between about 0.1 seconds and about 3.0 seconds, and optionally between about 0.5 seconds and about 1.5 seconds.

The hydrogen plasma removes the ligands from the silicon precursor adsorbed on the substrate, thereby forming amorphous silicon. In an embodiment where the silicon precursor is hexachlorodisilane (HCDS), HCDS and $H_2$ react with each other, leaving only silicon atoms on the substrate while producing HCl as a by-product.

During a fourth time period t4, a purge gas is supplied to the reaction chamber to remove any unreacted precursor and/or by-products. Examples of purge gases include, but are not limited to, inert gases, such as argon (Ar), nitrogen ($N_2$), and/or helium (He). The duration of the fourth time period t4 can be between about 0.1 seconds and about 3.0 seconds, and optionally between about 0.5 seconds and about 1.5 seconds. In certain embodiments, this step may be omitted.

The first to fourth time periods t1-t4 form a deposition cycle. The deposition cycle may be repeated at least twice until a thin film having a desired thickness is formed. For example, during a fifth time period t5, the silicon precursor may be supplied to the reaction chamber with RF power on. During a sixth time period t6, a purge gas may be supplied to the reaction chamber. During a seventh time period t7, hydrogen gas may be supplied to the reaction chamber while RF power is applied to the reaction chamber. Subsequently, during an eighth time period t8, a purge gas may be supplied to the reaction chamber. The fifth to the eighth time periods t5-t8 form another deposition cycle. It will be understood that beginning and end points for a cycle can be arbitrarily chosen (e.g., t2-t5 or t3-t6 can also be considered cycles). In one embodiment, the method may be carried out at a reaction chamber temperature of about 300° C. or lower.

In the method described above, during the first time period t1 in each deposition cycle, the silicon precursor is activated by plasma, and at least a portion of the silicon precursor is decomposed to silicon atoms without ligands. At least some of the silicon atoms are deposited on the substrate. However, other portions of the silicon precursor may still include one or more ligands. Such other portions of the silicon precursor may be adsorbed on the substrate. Thus, at least a portion of the silicon-containing layer may include ligands bonded to the silicon atoms in the layer. During the second time period t2, the purge gas may at least partially remove by-products and/or ligands bonded via a dangling bond to the silicon atoms. During the third time period t3, remaining ligands bonded to silicon atoms in the silicon-containing layer may be more effectively removed by the hydrogen plasma. This allows more effective deposition of the silicon precursor during the next deposition cycle. Thus, the layer resulting from the method can have a uniform thickness and a good step coverage compared to a layer formed by a conventional CVD process.

In the embodiments described above, amorphous silicon films can be deposited at a relatively low temperature, for example, about 300° C. or lower, compared to a conventional CVD process. The resulting films have better step-coverage and uniformity than films resulting from the conventional CVD process while having a smaller roughness than films resulting from the conventional CVD process.

EXAMPLES

An amorphous silicon (Si) film was deposited on a substrate in the reaction chamber of a Stellar™ reactor having a showerhead available from ASM Japan K.K., Tokyo, Japan. The substrate was placed on a susceptor within the reaction chamber. The substrate had a surface covered with a silicon dioxide layer, and the amorphous silicon film was deposited on the silicon dioxide layer.

In Examples 1-3 described below, the temperature of the substrate was maintained at 200° C. to 300° C. during deposition. The temperature of the susceptor was maintained between 250° C. and 350° C. The temperature of the substrate was about 50 degrees lower than that of the susceptor. It is believed that the temperature difference was due to a loss of heat when the susceptor heats the substrate. The pressure of the reaction chamber during deposition was maintained at 3.0 torr.

Example 1

In Example 1, a deposition process was conducted repeating a cycle which includes two steps, as shown in FIG. 1. The cycle includes steps of: (1) supplying a silicon precursor (hexachlorodisilane) with a carrier gas (argon (Ar) gas) and hydrogen gas ($H_2$) into the reaction chamber for 1 second; and (2) purging the reaction chamber with argon gas for 1 second. During the step (1), the carrier gas was supplied through a silicon precursor container at a flow rate of 100 sccm. In addition, the hydrogen gas was supplied at a flow rate of 100 sccm. During the step (1), 600 W of RF power was applied to the reaction chamber to generate in-situ hydrogen plasma. Steps (1) and (2) were repeated 500 times.

Example 2

In Example 2, a deposition process was conducted repeating a cycle which includes four steps, as shown in FIG. 2. The cycle includes steps of: (1) supplying a silicon precursor (hexachlorodisilane) with a carrier gas (argon (Ar) gas) and hydrogen gas ($H_2$) into the reaction chamber for 1 second; (2) purging the reaction chamber with argon gas for 2 seconds; (3) supplying hydrogen gas ($H_2$) into the reaction chamber for 1 second; and (4) purging the reaction chamber with argon gas for 2 seconds. During the step (1), the carrier gas was supplied through a silicon precursor container at a flow rate of 100 sccm. In addition, the hydrogen gas was supplied at a flow rate of 100 sccm. During the step (3), the hydrogen gas was supplied at a flow rate of 100 sccm. During the steps (1) and (3), 600 W of RF power was applied to the reaction chamber to generate in-situ hydrogen plasma. Steps (1) to (4) were repeated 500 times.

Example 3

In Example 3, a deposition process was conducted repeating a cycle which includes four steps, as shown in FIG. 3. The cycle includes steps of: (1) supplying a silicon precursor (hexachlorodisilane) with a carrier gas (argon (Ar) gas) into the reaction chamber for 1 second; (2) purging the reaction chamber with argon gas for 2 seconds; (3) supplying hydrogen gas ($H_2$) into the reaction chamber for 1 second; and (4) purging the reaction chamber with argon gas for 2 seconds. During the step (1), the carrier gas was supplied through a silicon precursor container at a flow rate of 100 sccm, and 600 W of RF power was applied to the reaction chamber. During the step (3), the hydrogen gas was supplied at a flow rate of 100 sccm, and 600 W of RF power was applied to the reaction chamber to generate in-situ hydrogen plasma. Steps (1) to (4) were repeated 500 times.

Films Resulting From Examples 1-3

Figure 4A:
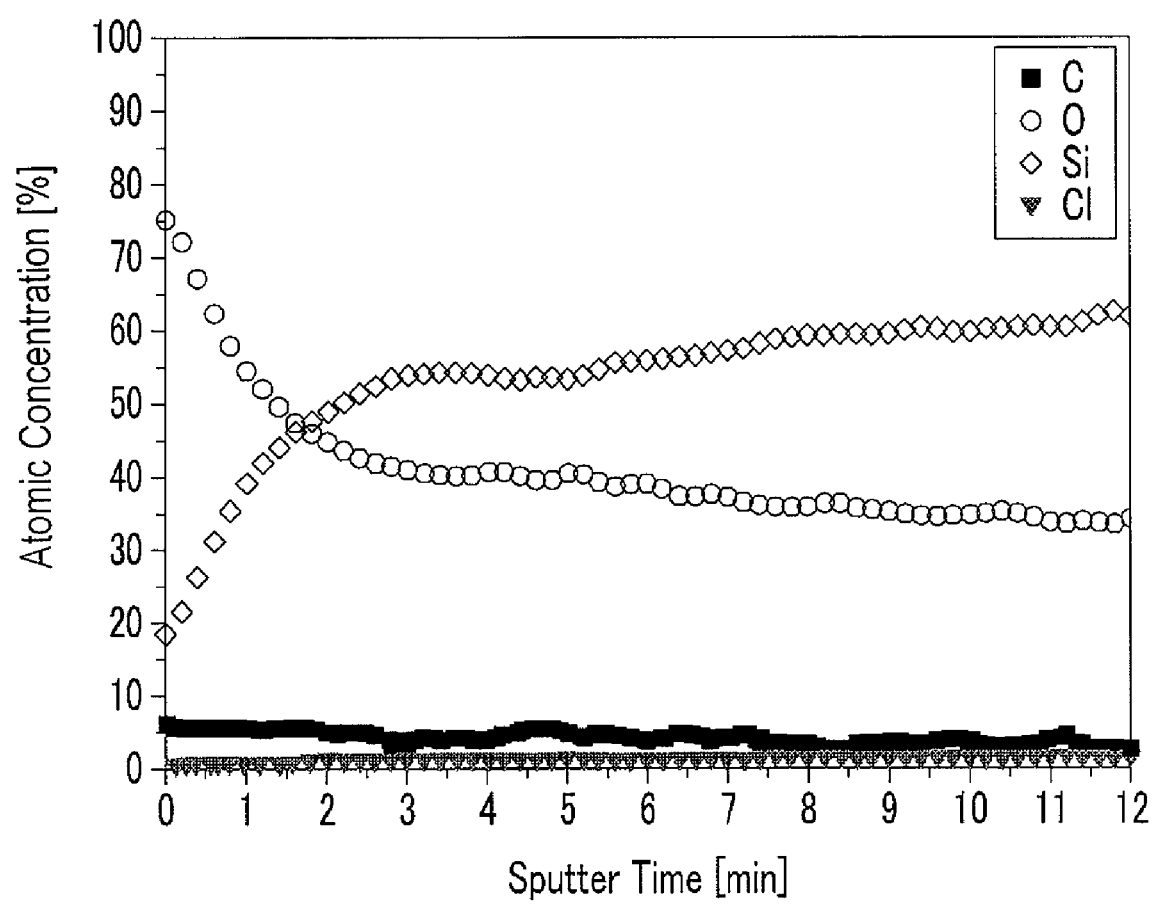
FIG. 4A is a graph illustrating atomic concentrations of a film resulting from Example 1 using the method of FIG. 1.
Figure 4B:
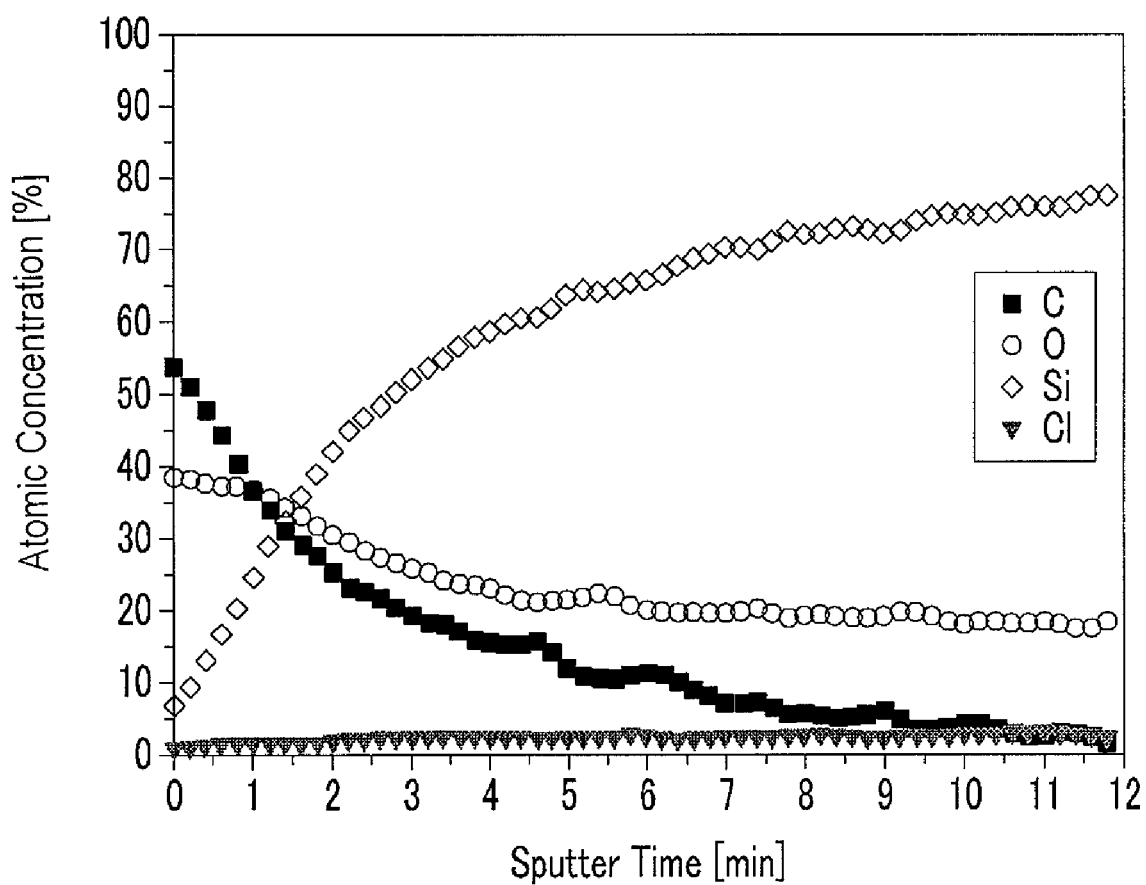
FIG. 4B is a graph illustrating atomic concentrations of a film resulting from Example 2 using the method of FIG. 2.
Figure 4C:
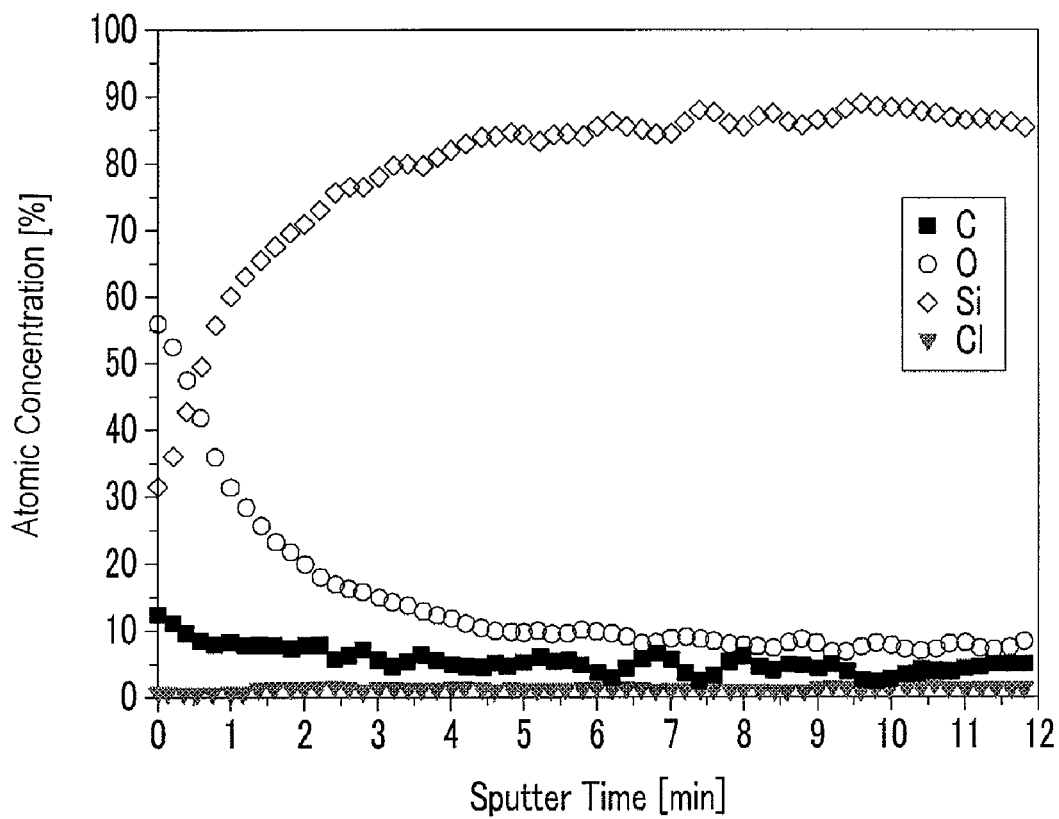
FIG. 4C is a graph illustrating atomic concentrations of a film resulting from Example 3 using the method of FIG. 3.

The atomic concentrations of the films resulting from Examples 1-3 are shown in FIGS. 4A-4C. In Examples 1-3, the substrates were cooled to room temperature, and then the substrates were exposed to air. The atomic concentrations of the films were measured by Auger electron spectroscopy (AES) analysis. In the AES analysis, a beam of electrons was sputtered onto a top surface of each of the resulting silicon films. Electrons emitted from the surface were collected for use in analysis of the composition of the film.

In FIGS. 4A-4C, the horizontal axis represents the duration of sputtering the beam of electrons, thus also representing the depth into the film, and the vertical axis represents atomic concentrations of elements in the films. C represents the atomic concentration of carbon atoms; O represents the atomic concentration of oxygen atoms; Si represents the atomic concentration of silicon atoms; and Cl represents the atomic concentration of chlorine atoms.

It is believed that oxygen atoms found in the films were from atmospheric oxygen gas that has diffused into the films after the deposition processes. Such diffusion of oxygen gas is at least partly attributable to a loose morphological structure of amorphous silicon resulting from the deposition processes, which is not typically found in crystalline silicon. Thus, the presence of oxygen atoms in the films indicates that the silicon films were at least partly in amorphous state.

In addition, the greater the concentration of oxygen atoms is, the more loose the morphological structure of the silicon film is. FIG. 4A shows a relatively greater concentration of oxygen atoms, compared to those of FIGS. 4B and 4C. FIG. 4B shows a relatively greater concentration of oxygen atoms compared to those of FIG. 4C. Thus, it is believed that the silicon film resulting from Example 1 has more loose morphological structure than the silicon film resulting from Example 2. In addition, it is believed that the silicon film resulting from Example 2 has more loose morphological structure than the silicon film resulting from Example 3.

The chlorine atoms in the films are residues of ligands that have not been removed from the films. Very low levels of chlorine indicate very effective scavenging of chlorine in all three processes.

Method of Making an Integrated Circuit Device

In manufacturing integrated circuit (IC) devices, a silicon oxide film may be used to electrically insulate circuit components from one another. However, if the density of a silicon oxide film is low, the film may not provide desired electrical insulation. Thus, there is a need for forming a dense silicon oxide film to provide desired electrical insulation.

Figure 5A:
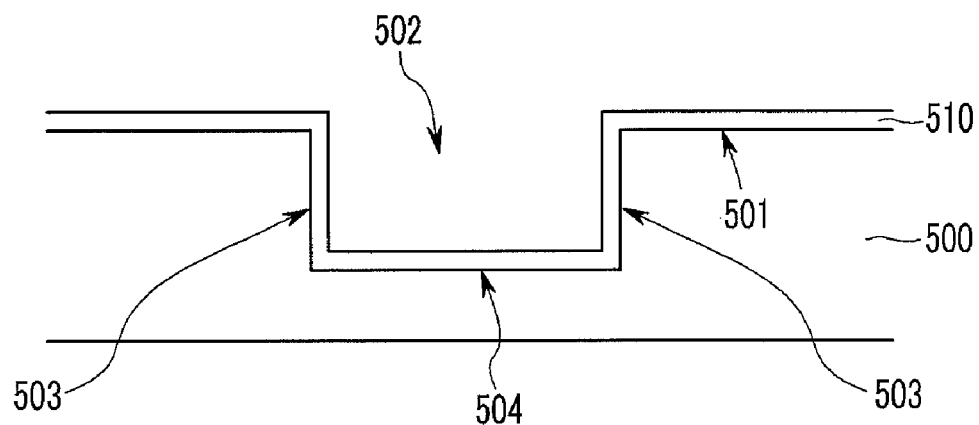
FIGS. 5A-5E illustrate a method of making an integrated circuit device according to one embodiment.

Referring to FIGS. 5A-5E, a method of making an integrated circuit device including a silicon dioxide film according to one embodiment will be described below. First, a substrate 500 is provided, as shown in FIG. 5A. The substrate 500 includes a trench or via 502 on a surface 501 thereof. The trench 502 includes side surfaces 503 and a bottom surface 504. A lining layer 510 is formed conformally on the surface 501 of the substrate 500, and the surfaces 503, 504 of the trench 502. The lining layer 510 may be formed of $Si_3N_4$ and/or $SiO_2$. $SiO_2$ may be grown from the trench sidewalls to repair damage from the trench etch, and $Si_3N_4$ may be deposited as a barrier layer.

Figure 5B:
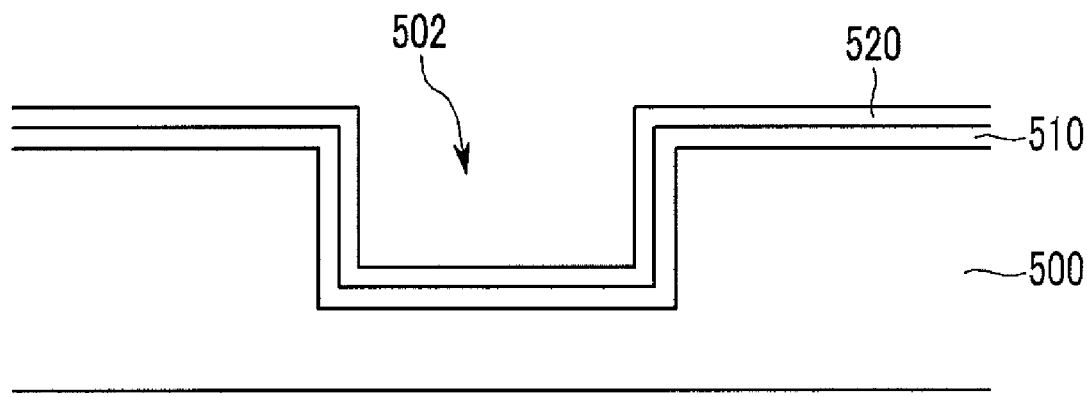

Subsequently, an amorphous silicon layer 520 is formed conformally on the lining layer 510, as shown in FIG. 5B. The amorphous silicon layer 520 may be formed by any of the methods described above in connection with FIGS. 1-3. The amorphous silicon layer 520 is undoped, and can have a good step-coverage, as described above.

Figure 5C:
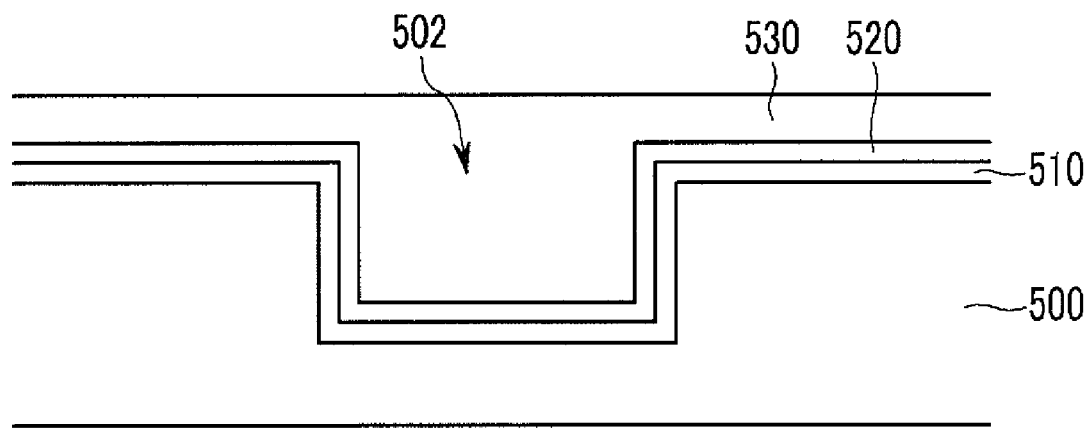

Then, as shown in FIG. 5C, a silicon dioxide ($SiO_2$) layer 530 is blanket deposited over the amorphous silicon layer 520, filling the trench 502. In the illustrated embodiment, a spin-on-glass (SOG) process may be performed to deposit the silicon dioxide layer 530.

Figure 5D:
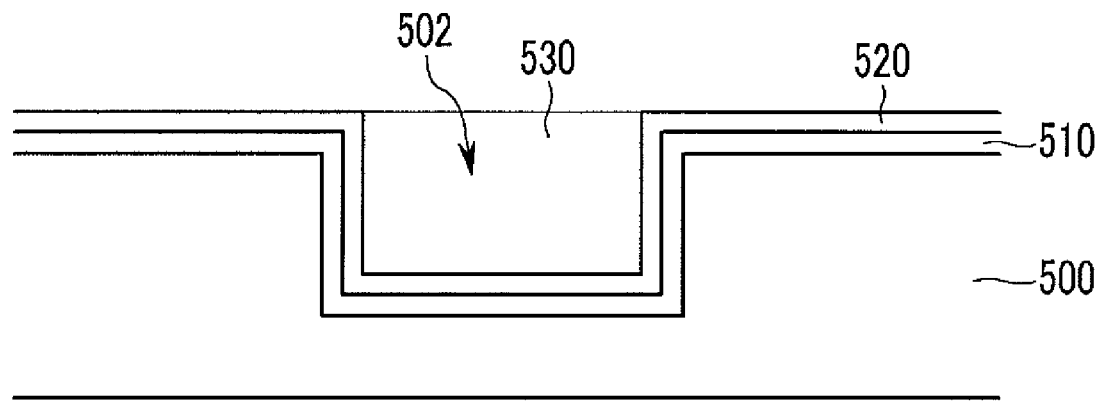
Figure 5E:
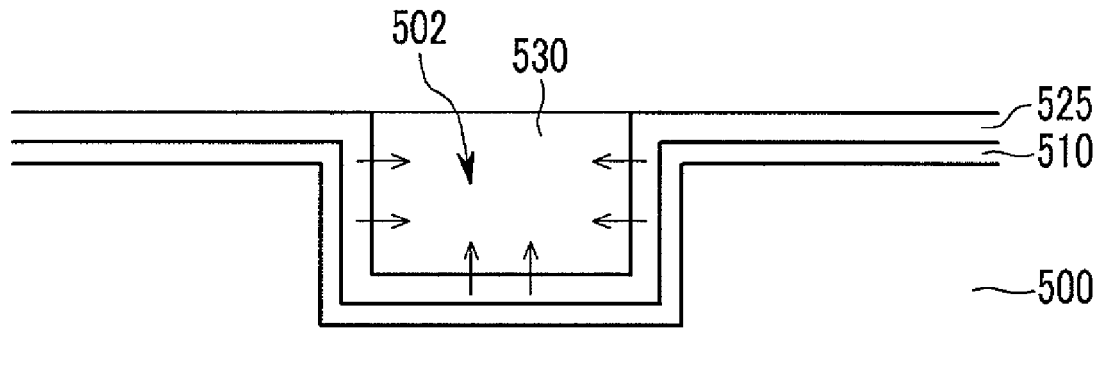

Subsequently, a portion of the silicon dioxide layer 530 is removed, such as by polishing stop on the amorphous silicon layer 520, as shown in FIG. 5D, or on the underlying liner 510. In the illustrated embodiment, chemical mechanical planarization or polishing (CMP) may be used to remove the portion of the silicon dioxide layer 530.

The resulting structure is subjected to a heat treatment to densify the SOG $SiO_2$ layer 530. The heat treatment may be performed at a temperature of about 600° C. to about 800° C., and optionally about 650° C. to about 750° C. The heat treatment may be performed in atmospheric gases, including oxygen gas. During the heat treatment, the oxide layer 530 densities and tends to shrink, which could cause voids. However, oxygen gas ($O_2$) also diffuses into the amorphous silicon layer 520, and the amorphous silicon is converted into silicon dioxide, thereby changing the amorphous silicon layer 520 to a silicon oxide layer 525. During this conversion, the amorphous silicon layer 520 expands in the directions shown by the arrows in FIG. 5E. Such expansion of the amorphous silicon layer 520 compensates for shrinkage of the silicon oxide 530, and may further compress the silicon dioxide 530 in the trench 502, thereby making the layer 530 denser. As a result, a silicon dioxide layer having a high density can be formed. Such a silicon oxide layer can provide commercially acceptable electrical insulation.

Electronic Devices

The methods described above can be adapted for making various electronic devices. The electronic devices can include integrated circuits. Examples of electronic devices can include, but are not limited to, consumer electronic products, parts of the consumer electronic products, electronic test equipments, etc. Examples of the electronic devices can also include memory chips, memory modules, circuits of optical networks or other communication networks, and disk driver circuits. The consumer electronic products can include, but are not limited to, a mobile phone, a telephone, a television, a computer monitor, a computer, a hand-held computer, a personal digital assistant (PDA), a microwave, a refrigerator, a stereo system, a cassette recorder or player, a DVD player, a CD player, a VCR, an MP3 player, a radio, a camcorder, a camera, a digital camera, a portable memory chip, a washer, a dryer, a washer/dryer, a copier, a facsimile machine, a scanner, a multi functional peripheral device, a wrist watch, a clock, etc. Further, the electronic device can include unfinished products.

In at least some of the aforesaid embodiments, any element used in an embodiment can interchangeably be used in another embodiment unless such a replacement is not feasible. It will be appreciated by those skilled in the art that various other omissions, additions and modifications may be made to the methods and structures described above without departing from the scope of the invention. All such modifications and changes are intended to fall within the scope of the invention, as defined by the appended claims.

We claim:

1. A method for forming an amorphous silicon thin film on a substrate, the method comprising:
   loading a substrate into a reaction chamber; and
   conducting a plurality of deposition cycles on the substrate, at least two of the cycles, each comprising:
      supplying a silicon precursor to the reaction chamber during a first time period;
      supplying hydrogen plasma to the reaction chamber at least partly during the first time period; and
      stopping supplying of the silicon precursor and the hydrogen plasma to the reaction chamber during a second time period between the first time period and an immediately subsequent deposition cycle.

2. The method of claim 1, wherein the at least two of the cycles further comprise supplying a purge gas to the reaction chamber at least partly during the second time period.

3. The method of claim 1, wherein the silicon precursor comprises a silane compound.

4. The method of claim 3, wherein the silane compound comprises a chlorosilane compound.

5. The method of claim 4, wherein the chlorosilane compound comprises chlorosilane ($SiH_3Cl$), dichlorosilane ($SiH_2Cl_2$), trichlorosilane ($SiHCl_3$), hexachlorodisilane ($Si_2H_6$), and silicon tetrachloride ($SiCl_4$).

6. The method of claim 1, wherein supplying the hydrogen plasma comprises:
   supplying hydrogen gas to the reaction chamber; and
   applying radio frequency power to the reaction chamber while supplying the hydrogen gas, thereby generating hydrogen plasma in situ.

7. The method of claim 1, wherein supplying the hydrogen plasma comprises supplying remotely generated hydrogen plasma to the reaction chamber.

8. The method of claim 1, wherein the at least two of the cycles further comprise supplying hydrogen plasma to the reaction chamber during a third time period between the second time period and the immediately subsequent deposition cycle, wherein no silicon precursor is supplied to the reaction chamber during the third time period.

9. The method of claim 8, wherein supplying the hydrogen plasma during the third time period comprises:
   supplying hydrogen gas to the reaction chamber; and
   applying radio frequency power to the reaction chamber while supplying the hydrogen gas, thereby generating hydrogen plasma in situ.

10. The method of claim 8, wherein the at least two of the cycles further comprise stopping supplying of the hydrogen plasma to the reaction chamber during a fourth time period between the third time period and the immediately subsequent deposition cycle.

11. The method of claim 10, wherein the at least two of the cycles further comprise supplying a purge gas to the reaction chamber at least partly during the fourth time period.

12. The method of claim 1, wherein conducting the plurality of deposition cycles comprises conducting the at least one deposition cycle at a reaction chamber temperature of about 300° C. or lower.

13. A method of making an electronic device, the method comprising:
providing a substrate including a trench including surfaces;
depositing amorphous silicon on one or more of the surfaces of the trench of a substrate by the method of claim 1;
filling the trench with silicon dioxide; and
performing a heat treatment to convert the amorphous silicon to silicon oxide.

14. The method of claim 13, wherein filling the trench comprises performing a spin-on-glass process.

15. An electronic device comprising a silicon dioxide layer formed by the method of claim 13.

16. A method for forming an amorphous silicon thin film on a substrate, the method comprising:
loading a substrate into a reaction chamber; and
conducting a plurality of deposition cycles on the substrate, at least two of the cycles, each comprising
supplying a silicon precursor to the reaction chamber during a first time period;
applying radio frequency power to the reaction chamber at least partly during the first time period;
stopping supplying of the silicon precursor and applying of the radio frequency power during a second time period between the first time period and an immediately subsequent deposition cycle; and
supplying hydrogen plasma to the reaction chamber during a third time period between the second time period and the immediately subsequent deposition cycle.

17. The method of claim 16, wherein no silicon precursor is supplied to the reaction chamber during the third time period.

18. The method of claim 17, wherein no hydrogen gas is supplied to the reaction chamber during the first time period.

19. The method of claim 16, wherein the at least two of the cycles further comprise supplying a purge gas to the reaction chamber at least partly during the second time period.

20. The method of claim 16, wherein the silicon precursor comprises a chlorosilane compound.

21. The method of claim 20, wherein the chlorosilane compound comprises chlorosilane ($SiH_3Cl$), dichlorosilane ($SiH_2Cl_2$), trichlorosilane ($SiHCl_3$), hexachlorodisilane ($Si_2H_6$), and silicon tetrachloride ($SiCl_4$).

22. The method of claim 16, wherein supplying the hydrogen plasma comprises:
supplying hydrogen gas to the reaction chamber; and
applying radio frequency power to the reaction chamber while supplying the hydrogen gas, thereby generating hydrogen plasma in situ.

23. The method of claim 16, wherein supplying the hydrogen plasma comprises supplying remotely generated hydrogen plasma to the reaction chamber.

24. The method of claim 16, wherein the at least two of the cycles further comprise supplying a purge gas to the reaction chamber during a fourth time period between the third time period and the immediately subsequent deposition cycle.

25. The method of claim 16, wherein conducting the plurality of deposition cycles comprises conducting the at least one deposition cycle at a reaction chamber temperature of about 300° C. or lower.

26. A method of making an electronic device, the method comprising:
providing a substrate including a trench including surfaces;
depositing amorphous silicon on one or more of the surfaces of the trench of a substrate by the method of claim 16;
filling the trench with silicon dioxide; and
performing a heat treatment to convert the amorphous silicon to silicon oxide.

27. The method of claim 26, wherein filling the trench comprises performing a spin-on-glass process.

28. An electronic device comprising: a silicon dioxide layer formed by the method of claim 26.

* * * * *